(12) United States Patent
Kate et al.

(10) Patent No.: US 7,256,864 B2
(45) Date of Patent: Aug. 14, 2007

(54) LIQUID IMMERSION LITHOGRAPHY SYSTEM HAVING A TILTED SHOWERHEAD RELATIVE TO A SUBSTRATE

(75) Inventors: Nicolaas Ten Kate, Almkerk (NL); Erik Roelof Loopstra, Heeze (NL); Aleksandr Khmelichek, Brooklyn, NY (US); Louis J. Markoya, Sandy Hook, CT (US); Harry Sewell, Ridgefield, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/403,196

(22) Filed: Apr. 13, 2006

(65) Prior Publication Data

US 2006/0238721 A1    Oct. 26, 2006

Related U.S. Application Data

(63) Continuation-in-part of application No. 11/108,673, filed on Apr. 19, 2005.

(51) Int. Cl.
  *G03B 27/52* (2006.01)
  *G03B 27/42* (2006.01)
(52) U.S. Cl. .......................... 355/30; 355/53
(58) Field of Classification Search ............... 355/30, 355/53, 55
  See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,405,701 A | 9/1983 | Banks et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |

(Continued)

FOREIGN PATENT DOCUMENTS

DE            206607            2/1984

(Continued)

OTHER PUBLICATIONS

"Depth-of-Focus Enhancement Using High Refractive Index Layer on the Imaging Layer", IBM Technical Disclosure Bulletin, vol. 27, No. 11, Apr. 1985, p. 6521.

(Continued)

*Primary Examiner*—Henry Hung Nguyen
(74) *Attorney, Agent, or Firm*—Sterne, Kessler, Goldstein & Fox, PLLC

(57) ABSTRACT

A liquid immersion lithography system includes projection optics and a showerhead. The projection optics are configured to expose a substrate with a patterned beam. The showerhead includes a first nozzle and a second nozzle that are configured to be at different distances from a surface of the substrate during an exposure operation.

5 Claims, 11 Drawing Sheets

U.S. PATENT DOCUMENTS

| | | |
|---|---|---|
| 6,236,634 B1 | 5/2001 | Lee et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,649,093 B2 | 11/2003 | Van Santen et al. |
| 6,781,670 B2 | 8/2004 | Krautschik |
| 6,788,477 B2 | 9/2004 | Lin |
| 6,809,794 B1 | 10/2004 | Sewell |
| 6,844,206 B1 | 1/2005 | Phan et al. |
| 6,844,919 B2 | 1/2005 | Suenaga |
| 6,952,253 B2 | 10/2005 | Lof et al. |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0207824 A1 | 10/2004 | Lof et al. |
| 2004/0211920 A1 | 10/2004 | Mari Derksen et al. |
| 2004/0224265 A1* | 11/2004 | Endo et al. ............ 430/322 |
| 2004/0233405 A1 | 11/2004 | Kato et al. |
| 2004/0239954 A1 | 12/2004 | Bischoff |
| 2004/0253547 A1 | 12/2004 | Endo et al. |
| 2004/0257544 A1 | 12/2004 | Vogel et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1* | 1/2005 | Streefkerk et al. ............ 355/30 |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0018208 A1 | 1/2005 | Levinson |
| 2005/0024609 A1 | 2/2005 | De Smit et al. |
| 2005/0030498 A1 | 2/2005 | Mulkens |
| 2005/0030501 A1 | 2/2005 | Mulkens et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068499 A1 | 3/2005 | Dodoc et al. |
| 2005/0078286 A1 | 4/2005 | Dierichs et al. |
| 2005/0078287 A1 | 4/2005 | Sengers et al. |
| 2005/0231695 A1 | 10/2005 | Wang et al. |
| 2006/0077367 A1 | 4/2006 | Kobayashi et al. |
| 2006/0098178 A1 | 5/2006 | Nagasaka et al. |
| 2006/0114435 A1* | 6/2006 | Hazelton et al. ............ 355/53 |
| 2006/0232753 A1 | 10/2006 | Khmelichek et al. |

FOREIGN PATENT DOCUMENTS

| | | |
|---|---|---|
| DE | 221563 A1 | 4/1985 |
| DE | 224448 A1 | 7/1985 |
| DE | 242880 A1 | 2/1987 |
| EP | 0023231 A1 | 2/1981 |
| EP | 0418427 A2 | 3/1991 |
| EP | 1039511 A1 | 9/2000 |
| EP | 1 420 300 A2 | 5/2004 |
| EP | 1 477 856 A1 | 11/2004 |
| EP | 1 489 462 A2 | 12/2004 |
| EP | 1 632 991 A1 | 3/2006 |
| FR | 2474708 | 7/1981 |
| JP | 58-202448 A | 11/1983 |
| JP | 62-065326 A | 3/1987 |
| JP | 62-121417 A | 6/1987 |
| JP | 63-157419 A | 6/1988 |
| JP | 04-305915 A | 10/1992 |
| JP | 04-305917 A | 10/1992 |
| JP | 06-124873 A | 5/1994 |
| JP | 07-132262 A | 5/1995 |
| JP | 07-220990 A | 8/1995 |
| JP | 10-228661 A | 8/1998 |
| JP | 10-255319 A | 9/1998 |
| JP | 10-303114 A | 11/1998 |
| JP | 10-340846 A | 12/1998 |
| JP | 11-176727 A | 7/1999 |
| JP | WO99/49504 * | 9/1999 |
| JP | 2000-058436 A | 2/2000 |
| JP | 2001-091849 A | 4/2001 |
| JP | 2004-193252 A | 7/2004 |
| WO | WO99/49504 A1 | 9/1999 |
| WO | WO 03/077036 A1 | 9/2003 |
| WO | WO 03/077037 A1 | 9/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057295 A2 | 7/2004 |
| WO | WO 2004/057589 A1 | 7/2004 |
| WO | WO 2004/086468 A1 | 10/2004 |
| WO | WO 2004/086470 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/097911 A1 | 11/2004 |
| WO | WO 2004/102646 A1 | 11/2004 |
| WO | WO 2004/105106 A1 | 12/2004 |
| WO | WO 2004/105107 A1 | 12/2004 |
| WO | WO 2004/107011 A1 | 12/2004 |
| WO | WO 2004/107417 A1 | 12/2004 |
| WO | WO 2004/112108 A1 | 12/2004 |
| WO | WO 2004/114380 A1 | 12/2004 |
| WO | WO 2005/015315 A2 | 2/2005 |
| WO | WO 2005/022616 A1 | 3/2005 |
| WO | WO 2005/036623 A1 | 4/2005 |
| WO | WO 2005/062351 A1 | 7/2005 |

OTHER PUBLICATIONS

Hata, H., "The Development of Immersion Exposure Tools", Litho Forum, International SEMATECH, Los Angeles, Jan. 27-29, 2004.

Hoffnagle, J.A. et al., "Liquid Immersion Deep-Ultraviolet Interferometric Lithography", J. Vac. Sci. Technol. B., vol. 17, No. 6, Nov./Dec. 1999, pp. 3306-3309.

Hogan, H., "New Semiconductor Lithography Makes a Splash", Photonics Technology World, Photonics Spectra, Oct. 2003.

Kawata, H. et al., "Fabrication of 0.2 μm Fine Patterns Using Optical Projection Lithography with an Oil Immersion Lens", Jpn. J. Appl. Phys. vol. 31 (1992), pp. 4174-4177.

Kawata, H. et al., "Optical Projection Lithography using Lenses with Numerical Apertures Greater than Unity", Microelectronic Engineering 9 (1989), pp. 31-36.

Lin, B.J., "Drivers, Prospects and Challenges for Immersion Lithography", TSMC, Inc., Sep. 2002.

Lin, B.J., "Proximity Printing Through Liquid", IBM Technical Disclosure Bulletin, vol. 20, No. 11B, Apr. 1978, p. 4997.

Lin, B.J., "The k3 Coefficient in Nonparaxial I/NA Scaling Equations for Resolution, Depth of Focus, and Immersion Lithography," *Journal of Microlithography, Microfabrication, and Microsystems*, vol. 1, No. 1, pp. 7-12, Apr. 2002.

Lin, B.J., "The Paths To Subhalf-Micrometer Optical Lithography", SPIE vol. 922, Optical/Laser Microlithography (1988), pp. 256-269.

Matsuyama, T. et al., "Nikon Projection Lens Update", SPIE Microlithography 2004, 5377-65, Mar. 2004.

Nikon Precision Europe GmbH, "Investor Relations—Nikon's Real Solutions", May 15, 2003.

Owa, S. et al., "Advantage and Feasibility of Immersion Lithography", Proc. SPIE 5040 (2003).

Owa, S. et al., "Immersion Lithography; its potential performance and issues", SPIE Microlithography 2003, 5040-186, Feb. 27, 2003.

Owa, S. et al., "Potential Performance and Feasibility of Immersion Lithography", NGL Workshop 2003, Jul. 10, 2003.

Owa, S. et al., "Update on 193nm Immersion Exposure Tool", Litho Forum, International SEMATECH, Los Angeles, Jan. 27-29, 2004.

Owen, G. et al., "1/8 μm Optical Lithography", J. Vac. Sci. Technol. B., vol. 10, No. 6, Nov./Dec. 1992, pp. 3032-3036.

Smith, B.W. et al., "Immersion Optical Lithography at 193nm", Future FAB International, vol. 15, Jul. 11, 2003.

Stevens, G.W.W., "Reduction of Waste Resulting from Mask Defects", Solid State Technology, Aug. 1978, vol. 21 008, pp. 68-72.

Suzuki, A., "Lithography Advances on Multiple Fronts", EEdesign, EE Times, Jan. 5, 2004.

Switkes, M. et al., "Immersion Lithography at 157 nm", J. Vac. Sci. Technol. B., vol. 19, No. 6, Nov./Dec. 2001, pp. 2353-2356.

Switkes, M. et al., "Immersion Lithography at 157 nm", MIT Lincoln Lab, Orlando 2001-1, Dec. 17, 2001.

Switkes, M. et al., "Immersion Lithography: Optics for the 50 nm Node", 157 Anvers-1, Sep. 4, 2002.

International Search Report, dated Apr. 19, 2006, for PCT Application No. PCT/NL2006/000202, 13 pages.

* cited by examiner

LIQUID IMMERSION LITHOGRAPHY SYSTEM HAVING A TILTED SHOWERHEAD RELATIVE TO A SUBSTRATE

CROSS REFERENCE TO RELATED APPLICATIONS

This a continuation-in-part of U.S. Appl. Ser. No. 11/108,673, filed Apr. 19, 2005 which is now abandoned, which is incorporated by reference herein in its entirety.

BACKGROUND

1. Field

The present invention relates to a lithographic apparatus and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask, a reticle, an array of individually controllable elements, etc. can be used to generate a circuit pattern to be formed on an individual layer of the IC. This pattern can be transferred onto a target portion (e.g., comprising part of, one, or several dies) on a substrate (e.g., a silicon wafer or a flat panel display substrate). Transfer of the pattern is typically via imaging onto a layer of radiation-sensitive material (resist) provided on the substrate.

In general, a single substrate will contain a network of adjacent target portions that are successively patterned. Known lithographic apparatus include steppers, in which each target portion is irradiated by exposing an entire pattern pattern onto the target portion at one time, and scanners, in which each target portion is irradiated by scanning the pattern through a radiation beam in a given direction (the "scanning"-direction), while synchronously scanning the substrate parallel or anti-parallel to this direction. It is also possible to transfer the pattern from the patterning device to the substrate by imprinting the pattern onto the substrate.

Highly integrated circuits require small circuit elements. Since the radiation pattern shapes the circuit elements, the smallest feature size depends on the resolution achieved in the lithography exposure step, or the resolution of the projection device used to project the radiation pattern onto the substrate. According to the Raleigh criterion, this resolution is proportional to the wavelength $\lambda$ of the projected light and to an adjustment factor $k1$, and inversely proportional to the sine function of the marginal, or capture, angle $\theta$ of the projection optics, where:

Resolution=$k1*\lambda/\sin(\theta)$

The resolution can be decreased, i.e., improved, in various ways. First, the wavelength $\lambda$ of the projected light can be decreased. A shorter wavelength may require different types of photoresist and a number of changes in the projection device, such as using a different light source and light filters, and special lenses for the projection optics. Second, the resolution can be decreased by decreasing the adjustment factor $k1$. Decreasing $k1$ may also require the use of different types of photoresist and high precision tools. Third, the marginal angle $\theta$ can be increased by increasing the size of the projection optics. The effect of increasing the marginal angle $\theta$ can be limited by the sine function above. One way to reduce the wavelength $\lambda$ of the projected light is through the use of immersion lithography.

It has been proposed to immerse the substrate in the lithographic projection apparatus in a liquid having a relatively high refractive index, e.g., water, so as to fill a space between the final element of the projection system and the substrate. The point of this is to enable imaging of smaller features since the exposure radiation will have a shorter wavelength in the liquid. The effect of the liquid can also be regarded as allowing the numerical aperture (NA) of the system to be higher than 1 and also increasing the depth of focus. Other immersion liquids have been proposed, including water with solid particles (e.g., quartz) suspended therein.

However, submersing the substrate or substrate and substrate table in a bath of liquid means that there is a large body of liquid that must be accelerated during a scanning exposure. This requires additional or more powerful motors and turbulence in the liquid can lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). A gap between the liquid supply system and the substrate allows these elements to move with respect to each other. Because of this gap, there is a need to have high surface tension between the immersion liquid and at least a "showerhead" or hood portion (showerhead and hood are used interchangeably throughout) of the liquid supply system to keep the immersion liquid from flowing through or breaking a meniscus formed at an edge of the gap. For example, a showerhead can be a portion of the liquid supply system that comprises inlet and outlet ports and/or channels. A problem that can arise in immersion lithography systems is formation of small contact angles between an immersion liquid and a surface of the substrate and the liquid supply system. The contact angle is defined by the surface energies between fluid and surface. Small contact angles mean large capillary forces, which may cause fluid break-through.

One concern in immersion lithography relates to ensuring purity and lack of contamination of the immersion liquid. In one example, the immersion liquid is recirculated using an injection system to inject the liquid into the volume between the projection optics and the substrate and an extraction or suction system to extract the liquid from the exposure area back into recirculation. However, the liquid can get contaminated, for example through receiving particles from the air or due to receiving material from the photoresist that is being exposed. Normally, filtering systems are in place to remove the contaminants.

Another concern, in a recirculation example, is that not all of the liquid that is injected into the exposure area may actually be recirculated due to the surface tension that exists between the liquid and a substrate surface. Although most of the liquid can be extracted, using the suction pressure of the extraction/recirculation system, some droplets of liquid remain on the surface of the substrate, together with their contaminants. Increasing the suction pressure generally does not help past a certain point because, although this will increase the recirculation speed, increased suction pressure may not address the problems caused by the surface tension of the liquid.

A further concern in immersion lithography is that above a certain scan speed the substrate will pull a film (or droplets) from the meniscus in a direction of the scan, i.e., cause a meniscus break. The speed at which the break occurs can be increased, allowing for faster scanning, by reducing a height of the meniscus (e.g., reducing a gap), which can have several effects. First, the moment of first water loss (e.g., meniscus break point) is shifted to a higher scan speed. Secondly, the amount of water that is lost is reduced, where height of water film~height of meniscus*velocity of scan^ (⅔). Whenever water is lost from the meniscus, an "air knife" can be used to hold the lost water. Although reducing the gap is typically satisfactory, other problems can occur.

The amount of water that passes through the air knife depends on a pressure gradient of the air on the substrate surface. A reduced gap size can lead to a higher pressure gradient, which can lead to less water loss. So, on the positive side, smaller gaps between the hood and substrate lead to less water loss. However, there are also several negative effects of a smaller gap. First, the air velocity above the substrate surface can increase, which can enhance the evaporation of water from the surface and can lead to increased cooling of the substrate, which is undesirable. Secondly, the air knife may hold "outside" water on the outside of the air knife, but it is desirable that this water "flows back" (e.g., is recollected) into the meniscus when scanning back (at the advancing meniscus).

Accordingly, what is needed is an immersion lithography system and method that ensures that substantially all of immersion liquid is collected by an extraction system and/or that an optimally sized gap is formed to reduce liquid loss and increase recollection of a liquid at the gap.

SUMMARY

In one embodiment of the present invention, there is provided an immersion lithography system comprising projection optics and a showerhead. The projection optics direct a patterned beam onto a substrate. The showerhead delivers liquid flow between the projection optics and the substrate. The showerhead includes a first nozzle and a second nozzle that are located at different distances from the substrate.

In another embodiment of the present invention, there is provided an immersion lithography system comprising projection optics and first and second nozzles. The projection optics are configured to expose a substrate. The first and second nozzles are located at different distances from the substrate.

In yet another embodiment of the present invention, a liquid immersion lithography system includes projection optics for exposing a substrate and an injection nozzle and a retrieval nozzle for delivering tilted liquid flow between the projection optics and the substrate. In one example, the liquid flow can be tilted at approximately 0.06 degrees or approximately 1 to 2 degrees relative to the substrate.

In a further embodiment of the present invention, an exposure system includes, in order of light propagation, a radiation source, a condenser lens, a mask (or contrast device), and projection optics. A liquid delivery system provides liquid to an exposure area below the projection optics. The exposure system also includes means for providing tilted liquid flow of the liquid.

In a still further embodiment of the present invention, an exposure system includes, in order of light propagation, a radiation source, a condenser lens, a mask, and projection optics. A liquid delivery system provides liquid to an exposure area of a substrate. The substrate is tilted relative to a horizontal.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
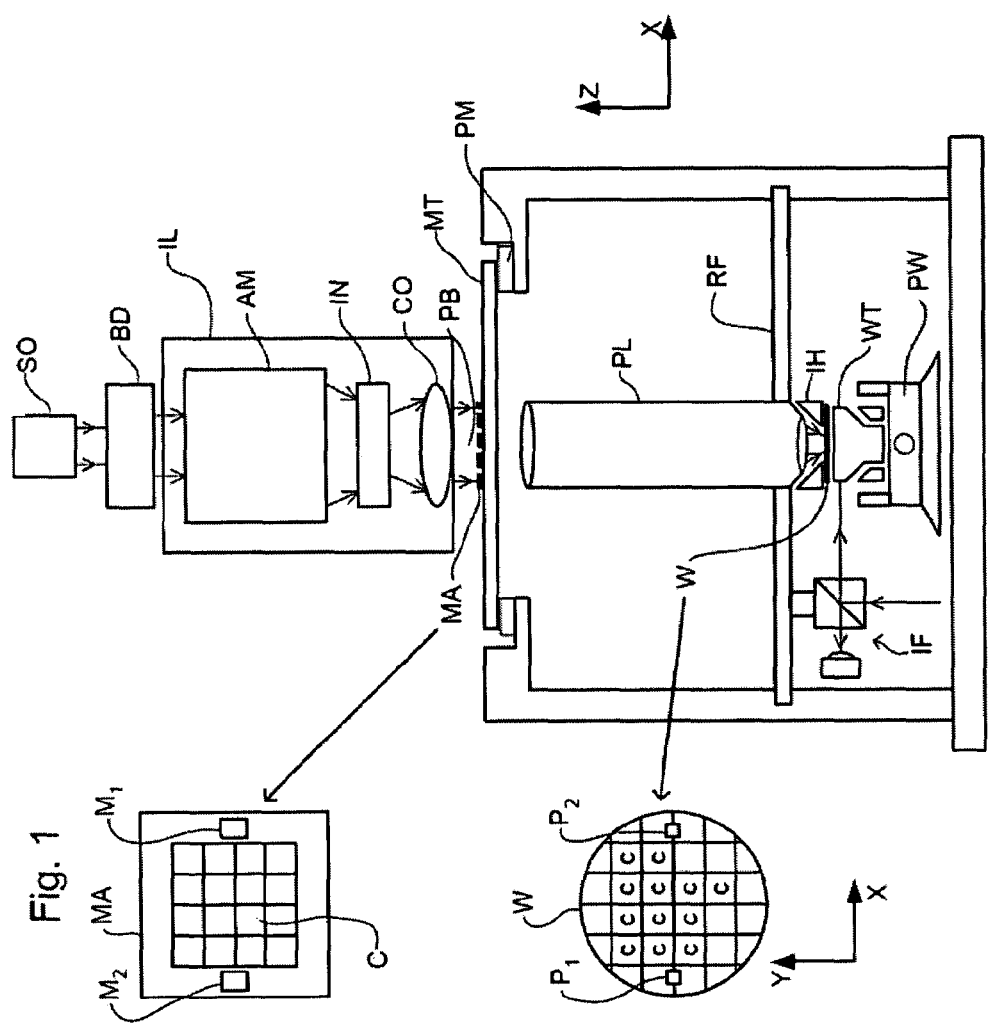
FIG. 1 depicts a lithographic apparatus according to an embodiment of the present invention

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

The inventors have discovered a rather unexpected phenomenon: when the liquid flow in an immersion lithography system is tilted, the tilt, and the corresponding effect of gravity on the liquid flow, is sufficient to overcome the residual surface tension forces acting on the liquid. Accordingly, with such a tilted arrangement, the pooling of the immersion liquid in certain portions of the exposure area can be substantially reduced or eliminated, reducing the possibility of contamination. The tilting can be either static or dynamic. Additionally, or alternatively, the tilting can allow for optimal gap dimensions between a hood and a substrate on both sides of the hood to allow for a reduction in water loss through a meniscus of the gap in a scan direction and an increased recollection of water at the meniscus when the scanning direction reverses.

FIG. 1 schematically depicts a lithographic apparatus according to one embodiment of the invention. The apparatus comprises an illumination system, a support structure, a substrate table, and a projection system. The illumination system (illuminator) IL conditions a radiation beam PB (e.g., UV radiation or DUV radiation). The support structure (e.g., a mask table) MT supports a patterning device (e.g., a mask) MA and is connected to a first positioner PM configured to accurately position the patterning device in accordance with certain parameters. The substrate table (e.g., a wafer table) WT holds a substrate (e.g., a resist-coated wafer or a flat panel substrate) W and connected to a second positioner PW configured to accurately position the substrate in accordance with certain parameters. The projection system (e.g., a refractive projection lens system) PL projects a pattern imparted to the radiation beam PB by patterning device MA onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure can be a frame or a table, for example, which can be fixed or movable as required. The support structure can ensure that the patterning device is at a desired position, for example with respect to the projection system. Any use of the terms "reticle" or "mask" herein can be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device can be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system".

As here depicted, the apparatus is of a transmissive type (e.g., employing a transmissive mask). Alternatively, the apparatus can be of a reflective type (e.g., employing a programmable mirror array of a type as referred to above, or employing a reflective mask).

The lithographic apparatus can be of a type having two (dual stage) or more substrate tables (and/or two or more support structures). In such "multiple stage" machines the additional tables or support structure can be used in parallel, or preparatory steps can be carried out on one or more tables or support structures while one or more other tables or support structure are being used for exposure.

Referring to FIG. 1, the illuminator IL receives a radiation beam from a radiation source SO. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam, to have a desired uniformity and intensity distribution in its cross-section.

The radiation beam PB is incident on the patterning device MA, which is held on the support structure (e.g., mask table) MT, and is patterned by the patterning device. Having traversed the patterning device MA, the radiation beam PB passes through the projection system PL, which focuses the beam onto a target portion C of the substrate W. An immersion hood IH, which is described further below, supplies immersion liquid to a space between the final element of the projection system PL and the substrate W.

With the aid of the second positioner PW and position sensor IF (e.g., an interferometric device, linear encoder or capacitive sensor), the substrate table WT can be moved accurately, e.g., so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g., after mechanical retrieval from a mask library, or during a scan. In general, movement of the support structure MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW.

In the case of a stepper (as opposed to a scanner) the support structure MT can be connected to a short-stroke actuator only, or can be fixed. Patterning device MA and substrate W can be aligned using patterning device alignment marks M1, M2 and substrate alignment marks P1, P2.

Although the substrate alignment marks as illustrated occupy dedicated target portions, they can be located in spaces between target portions (these are known as scribe-lane alignment marks). Similarly, in situations in which more than one die is provided on the patterning device MA, the patterning device alignment marks can be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT can be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use can also be employed.

Figure 2:
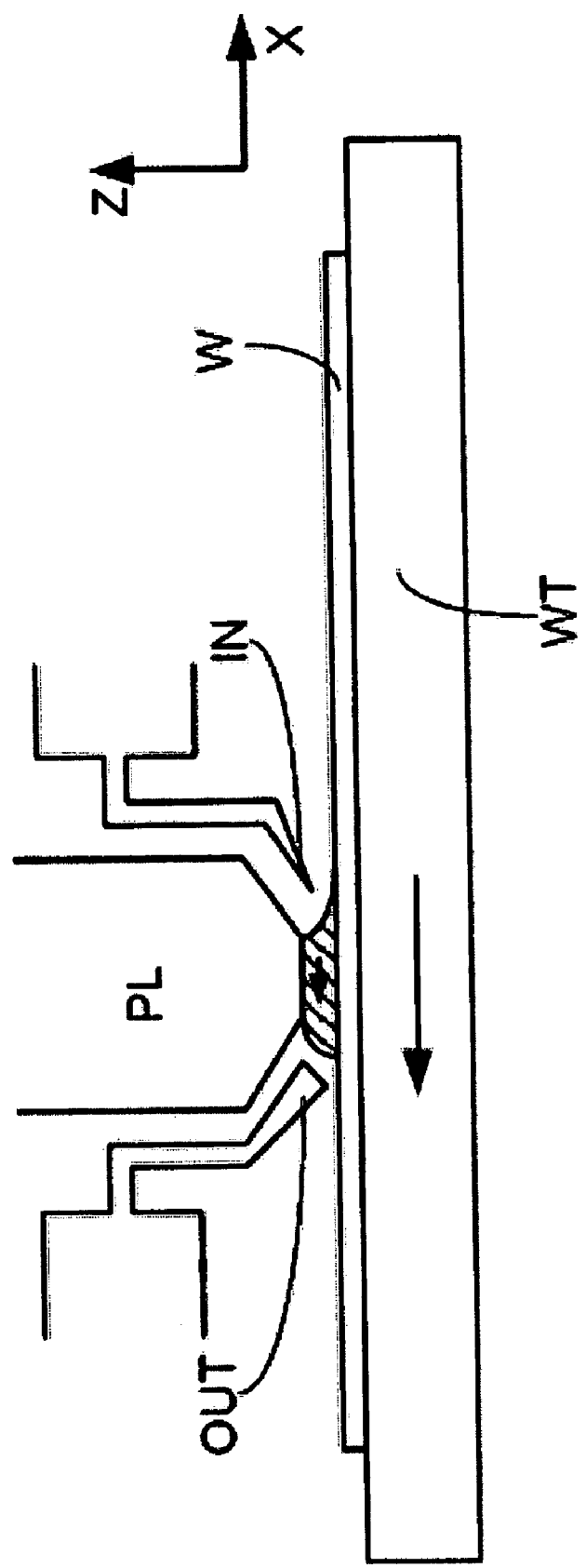
FIGS. 2 and 3 depict a liquid supply system for use in a lithographic projection apparatus.
Figure 3:
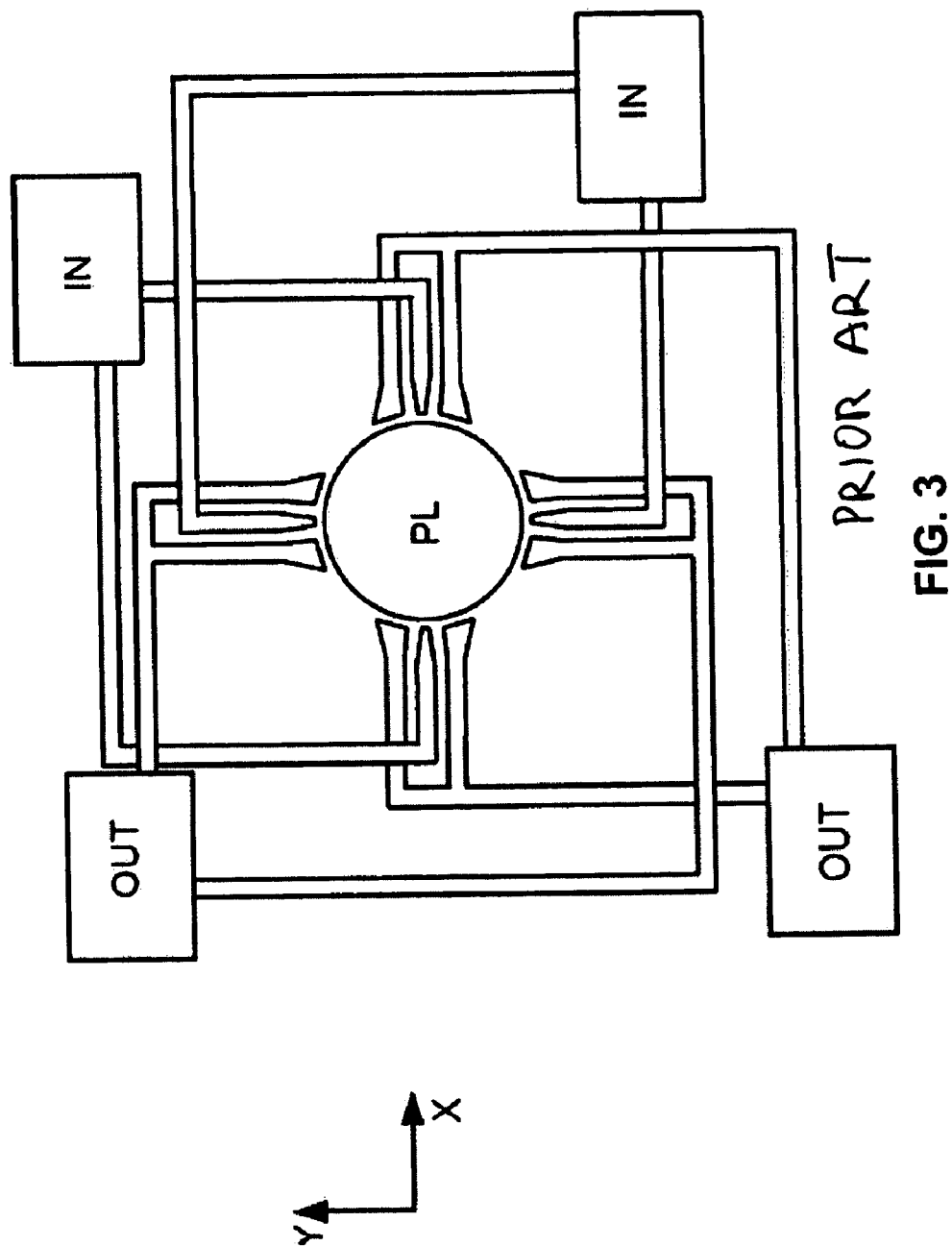

FIGS. 2 and 3 depict a liquid supply system for use in a lithographic projection apparatus. As illustrated in FIGS. 2 and 3, liquid, shown as a darkened area under projection system PL, is supplied by at least one inlet IN onto the substrate W along the direction of movement (shown as an arrow) of the substrate W relative to a final element of projection system PL. The liquid is removed by at least one outlet OUT after having passed under the projection system PL. That is, as the substrate W is scanned beneath the element in a −X direction, liquid is supplied at the +X side (in this perspective the right side) of the element and taken up at the −X side (in this perspective the left side) of the element.

FIG. 2 shows the arrangement schematically in which liquid is supplied via inlet IN and is taken up on the other side of the element by outlet OUT, which can be connected to a low pressure source. Although in the illustration of FIG. 2 the liquid is supplied along the direction of movement (noted by the arrow) of the substrate W relative to the final element of projection system PL, though this does not need to be the case.

Various orientations and numbers of in- and out-lets positioned around the final element are possible. For example, the arrangement shown in FIG. 3. In this example, four sets of an inlet with an outlet on either side are provided in a regular pattern around the final element of projection system PL.

Figure 4:
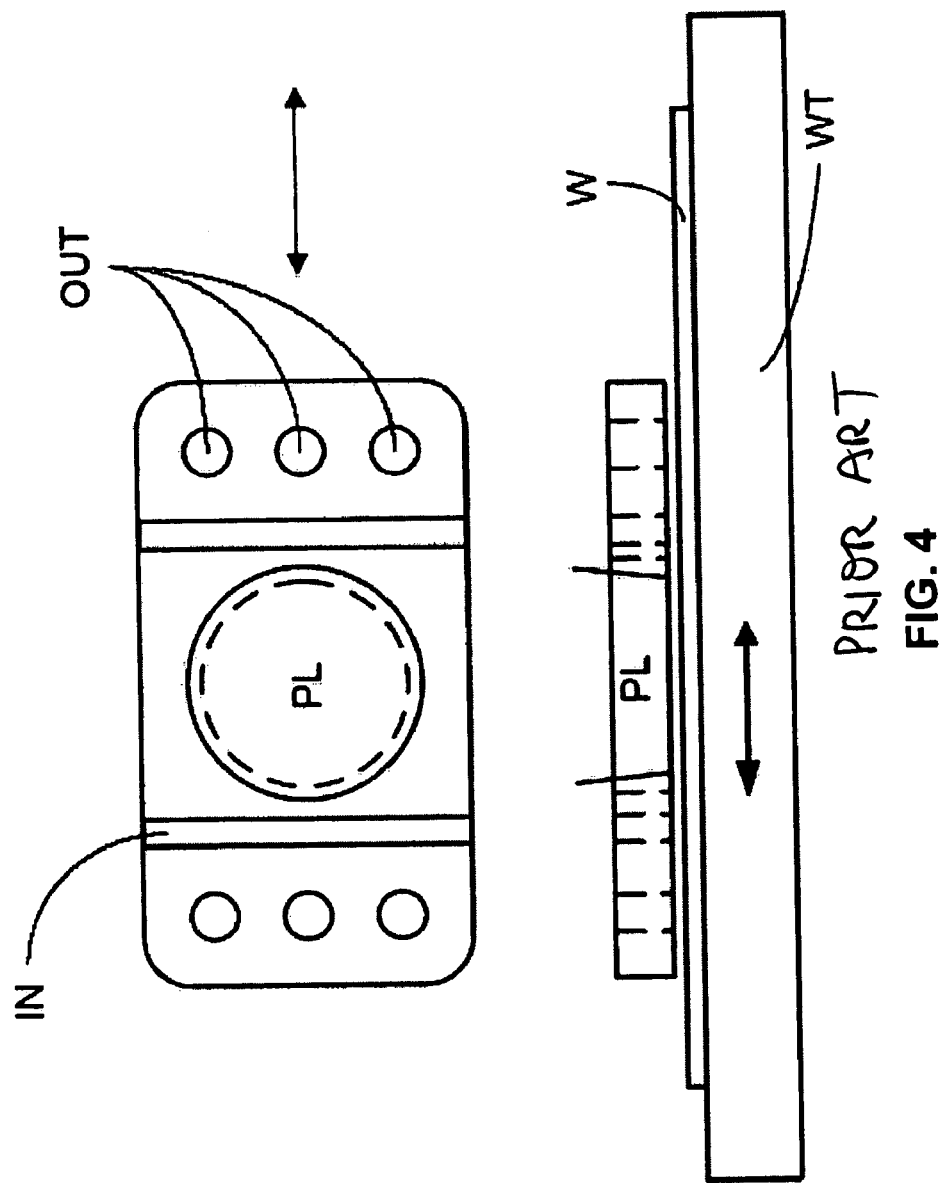
FIG. 4 depicts another liquid supply system for use in a lithographic projection apparatus.

FIG. 4 depicts another liquid supply system for use in a lithographic projection apparatus. In this example, a localized liquid supply system is shown. Liquid is supplied by two groove inlets IN on either side of the projection system PL and is removed by a plurality of discrete outlets OUT arranged radially outwardly of the inlets IN. The inlets IN and outlets OUT can be arranged in a plate with a hole in its center, and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
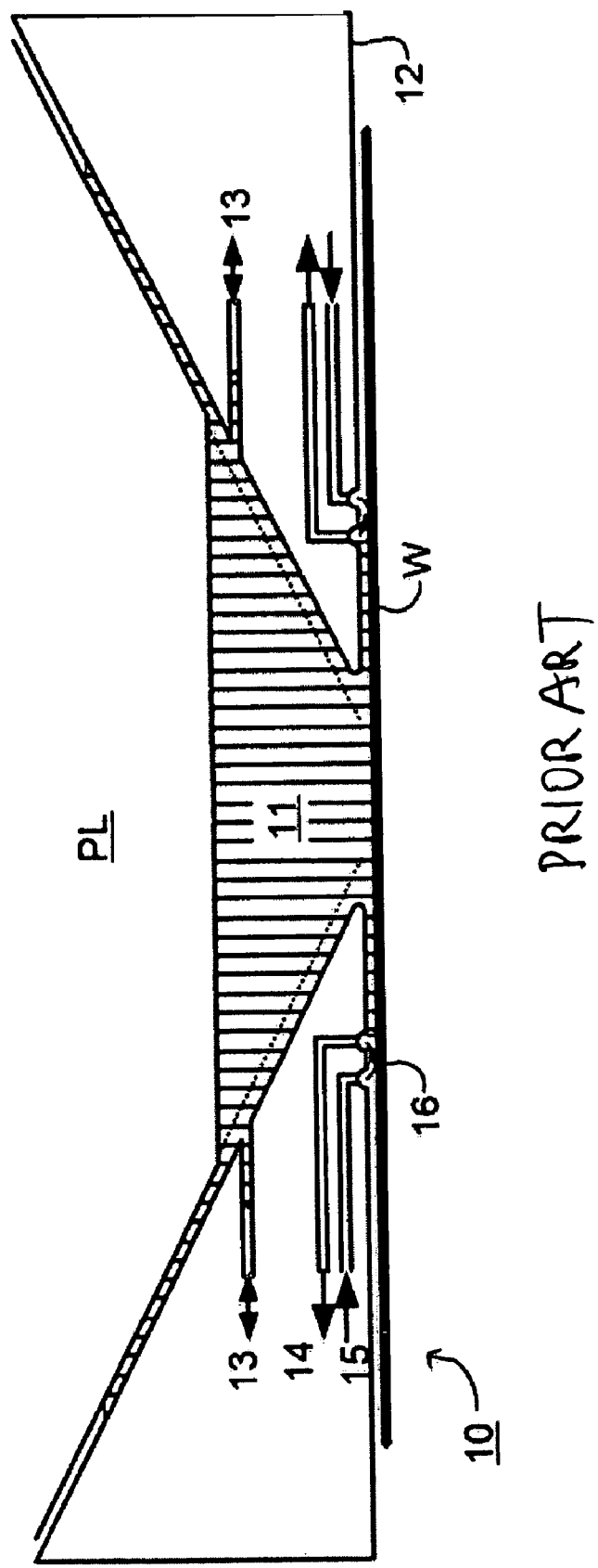
FIG. 5 depicts another liquid supply system for use in a lithographic projection apparatus.

FIG. 5 depicts another liquid supply system for use in a lithographic projection apparatus. In this example, a lithography device with a localized liquid supply system solution is to provide the liquid supply system with a liquid confinement structure 12 that extends along at least a part of a boundary of the space between the final element of the projection system PL and the substrate table WT. The liquid confinement structure 12 is substantially stationary relative to the projection system PL in the XY plane, though there can be some relative movement in the Z direction (in the direction of the optical axis). In an embodiment, a seal 16 is formed between the liquid confinement structure 12 and the surface of the substrate W.

In one example, reservoir 10 forms a contactless seal to the substrate W around the image field of the projection system PL so that liquid 11 is confined to fill a space between the substrate W surface and the final element of the projection system PL. The reservoir 10 is formed by a liquid confinement structure 12 positioned below and surrounding the final element of the projection system PL. Liquid 11 is brought into the space below the projection system PL and within the liquid confinement structure 12. The liquid confinement structure 12 extends a little above the final element of the projection system PL and the liquid level rises above the final element so that a buffer of liquid 11 is provided. The liquid confinement structure 12 has an inner periphery that at the upper end. In one example, the upper end closely conforms to the shape of the projection system PL or the final element thereof and can be, e.g., round. At the bottom, the inner periphery closely conforms to the shape of the image field, e.g., rectangular, though this need not be the case.

In one example, the liquid 11 is confined in the reservoir 10 by a gas seal 16 between the bottom of the liquid confinement structure 12 and the surface of the substrate W. The gas seal 16 is formed by gas. In various examples, the gas can be air, synthetic air, $N_2$ or another inert gas, which is provided under pressure via inlet 15 to the gap between liquid confinement structure 12 and substrate W and extracted via outlet 14. The overpressure on the gas inlet 15, vacuum level on the outlet 14, and geometry of the gap are arranged so that there is a high-velocity gas flow inwards that confines the liquid. Such a system is disclosed in U.S. Pat. No. 6,952,253 that issued Oct. 4, 2005, which is hereby incorporated by reference in its entirety.

In European Patent Application No. 03257072.3, which is incorporated by reference herein in its entirety, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Exemplary Tilted Configurations

Figure 6:
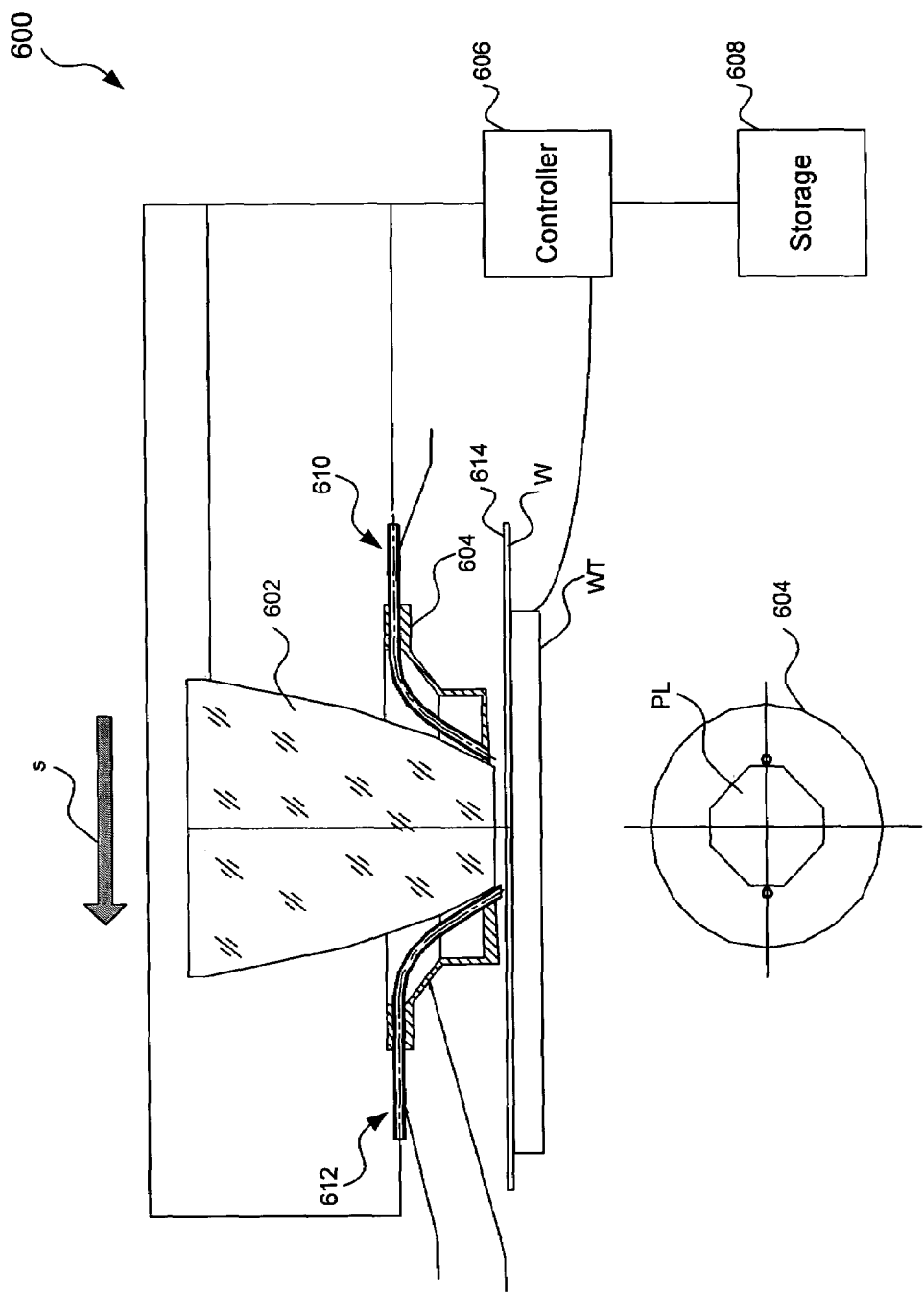
FIG. 6 illustrates a tilted showerhead, according to one embodiment of the present invention.

FIG. 6 shows a portion 600 of the lithography system in more detail, according to one embodiment of the present invention. Portion 600 includes a last element or lower portion 602 of projection optics PL, a hood or showerhead 604 (used interchangeably throughout), substrate W supported by substrate stage WT, an optional controller 606, and an optional storage device 610. FIG. 6 illustrates both a cross-sectional view (at the top) and a plan view (at the bottom) of this embodiment of the portion of the immersion lithography system with a tilted arrangement.

Showerhead 604 includes a first nozzle 610 and a second nozzle 610. When a tilted arrangement is used, as discussed below, the operation and/or positioning of nozzles 610 or 612 at an instant in time can be based on which one of nozzles 610 or 612 is "leading" and which one is "trailing" in a scan direction S, shown by the arrow S. In the example shown, with the scanning direction S as shown, the "trailing" nozzle is nozzle 610 and the "leading" nozzle is nozzle 612. Last element 602 of projection optics PL is located above a surface 614 of substrate W. Last element 602 of projection optics PL can be, for example, a prism, or a lens, a glass window, or the like. In this example, there are different heights of injection nozzle 610 and retrieval nozzle 612 in the exposure area, e.g., distances from each nozzle 610 and 612 to surface 614 of substrate W, which is illustrated in more detail in FIG. 7. The height differential resulting from the different heights can cause the tilted arrangement.

In one example, tilting of showerhead 604 can allow for an optimal gap dimension between showerhead 604 and substrate W on both sides of showerhead 604 to allow for a reduction in water loss in a scan direction S and an increased recollection of water when the scanning direction reverses. For example, a gap between showerhead 604 and substrate W can be about 100 microns and each nozzle can be tilted 50 microns in opposite directions, such that there is a 100 micron total tile. The tilt can be over 90 mm, which produces about a 1/1000 ratio (rise over run). This ratio allows for about a 1 mrad or 0.06° tilt, which is enough to optimize gap size on both sides of showerhead 640.

In another example, during a recirculation operation, when substrate W is moving in the scanning direction S as shown, liquid flow enters the exposure area through first nozzle 610 (e.g., an injection nozzle and exits through second nozzle 612 (e.g., a retrieval or suction nozzle), which is spaced closed to a surface 614 of substrate W than nozzle 610. In one example, a dimension of a gap between last element 602 of projection optics PL and surface 614 of substrate W can be approximately one millimeter or range between about 0.5 millimeters and about 2 millimeters. When the scanning direction is reversed, the function and/or position of nozzles 610 and 612 may also be reversed.

Additionally, or alternatively, it is possible to leave one of the nozzles 610 or 612 in its original location and correspondingly raise or lower the other nozzle 610 or 612, so as to create a tilt. The tilting can be done statically or dynamically. When done statically, a same one of first or second nozzles 610 and 612 is always closer to surface 614 of substrate W. When done dynamically, which one of first or second nozzles 610 or 612 is closer to surface 614 of substrate W changes based on predetermined criteria of the immersion lithography system.

In an exemplary dynamic operation, the raising and lowering of the respective nozzle or both nozzles 610 and 612 can be performed through control signals generated by controller 606. Controller 606 can receive signals from projection optics PL and substrate stage WT, which signals correspond to characteristics of the scanning, for example, a scanning speed or a scanning direction. Based on the characteristics of the scanning, controller 606 can generate control signals to control one or both of showerhead 604 and substrate stage WT, such that showerhead 604 is tilted with respect to substrate stage WT. This can allow for the tilted flow of the immersion liquid.

Additionally, or alternatively, a tilt angle and/or tilt direction between showerhead 604 and substrate W can be related to the detected characteristics of scanning. For example, a determined scanning speed can correlate to a predetermined tilt angle, which may be stored in optional storage device 608.

Additionally, or alternatively, the tilt angle can be based on either information determined during a calibration operation or calculated based on inherent characteristics of lithography system 600, which may be stored in a look-up table in storage device 608.

Figure 7:
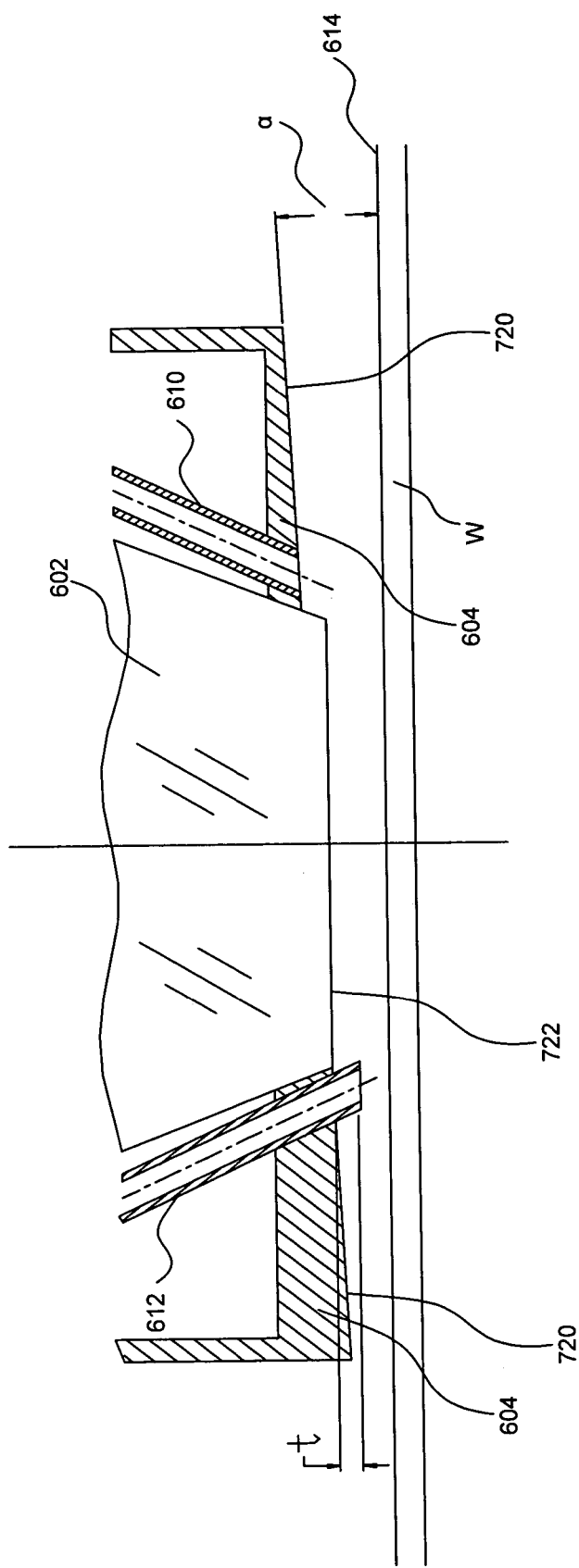
FIG. 7 illustrates a close-up view of the tilted showerhead arrangement of FIG. 6.

FIG. 7 illustrates a close up view of the tilted nozzle arrangement shown in FIG. 6. In one example, a bottom surface 720 of showerhead 604 can be tilted at an angle α, which may be approximately 0.06° for optimizing gap distances and/or about 1 to 2° for increasing recirculation efficiency. In a recirculation scheme, the extraction nozzle, which is second nozzle 612 in this embodiment, is located below a bottom surface 722 of last element 602 of projection optics PL by a distance t (see left hand side of the figure).

Figure 8:
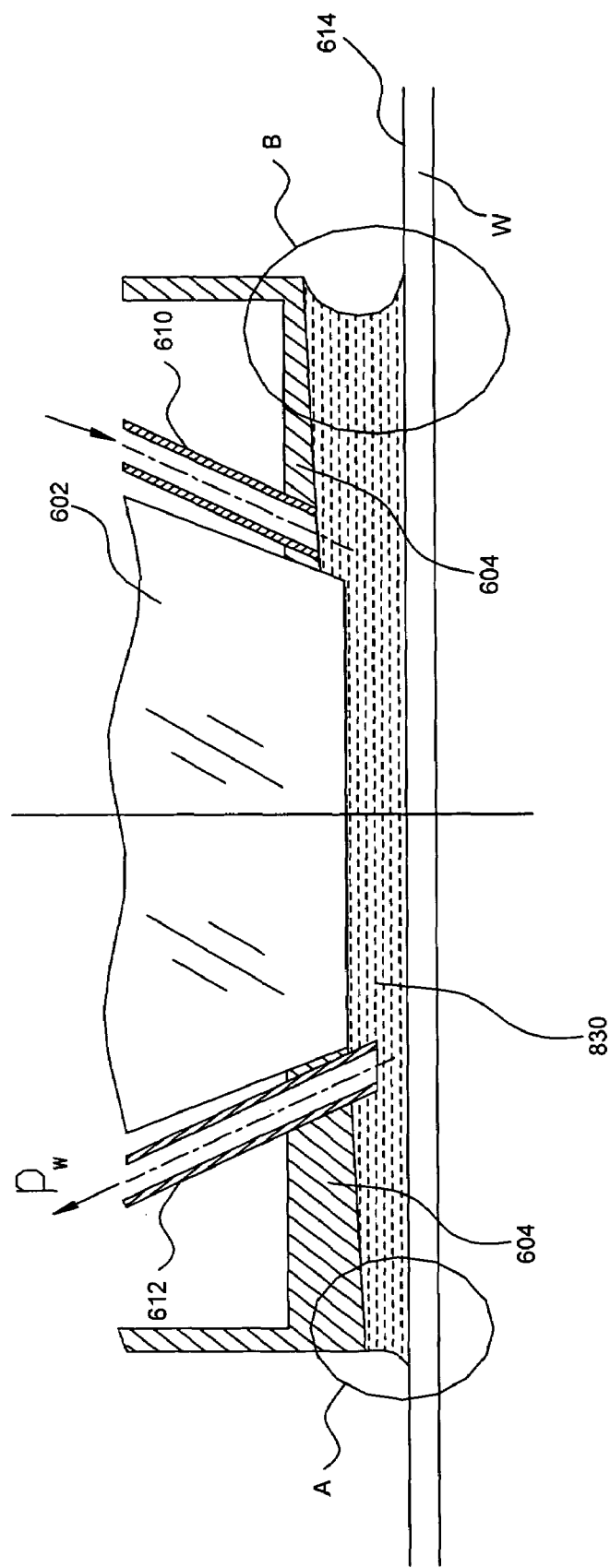
FIG. 8 is another illustration of the exposure area of a liquid immersion lithography system with a liquid in the exposure area.

FIG. 8 is another illustration of the exposure area of a liquid immersion lithography system 600, similar to FIG. 7. However, FIG. 8 also shows an immersion liquid 830 in the exposure area, as would be the case during actual operation of the device. FIG. 8 also shows parameters of the lithography system including a withdrawal pressure $p_w$ and two regions A and B, which include two meniscus regions, discussed further below.

Figure 9:
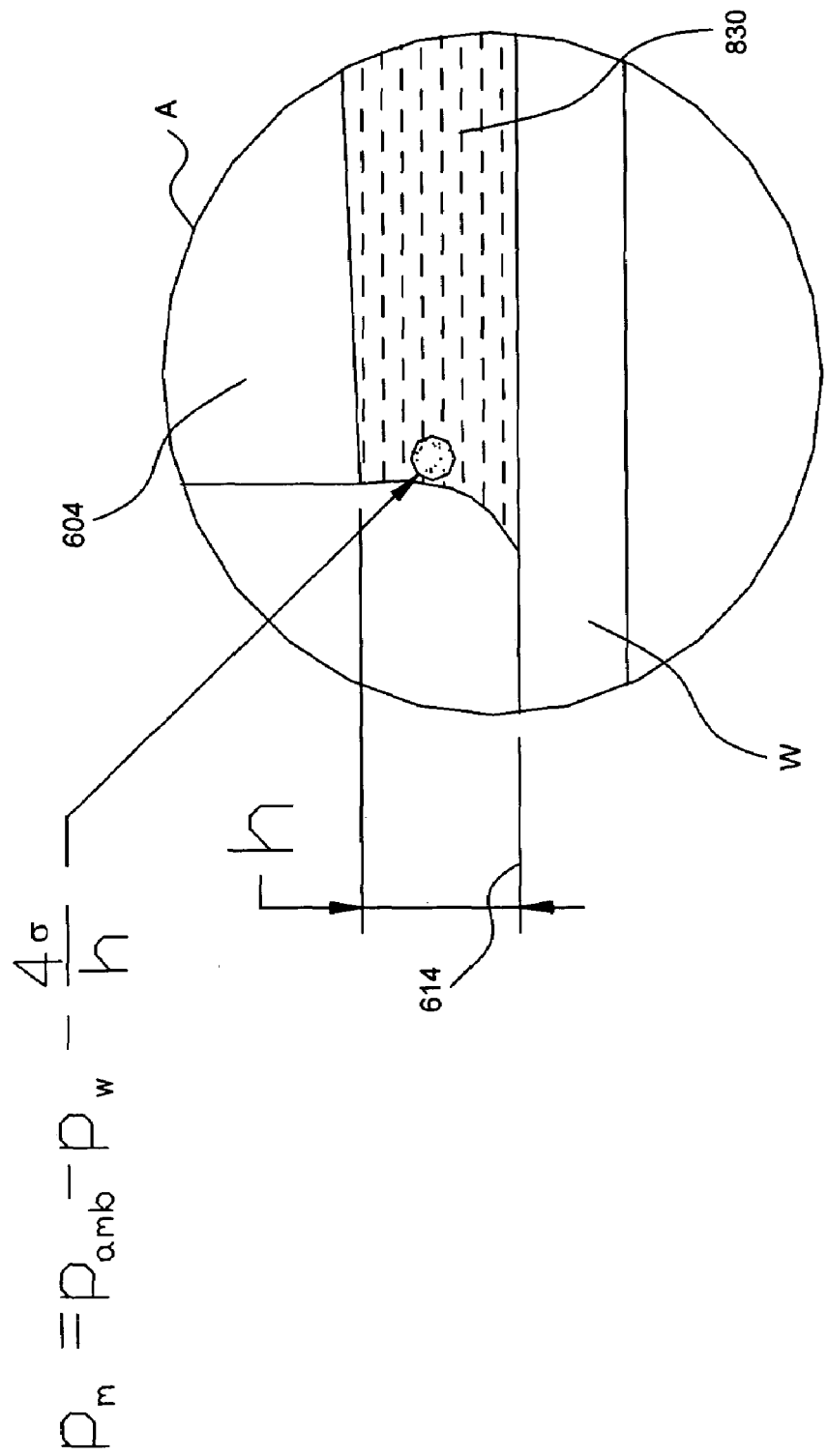
FIG. 9 illustrates a meniscus region A of FIG. 8.

FIG. 9 illustrates a meniscus region A from FIG. 9, which includes a height "h," which refers to a gap height, and the shape of the meniscus, which is outward. The pressure in immersion liquid 830 adjacent to the meniscus (pm) can be reduced due to an effect of surface tension. The exact pressure at this location will depend on the detailed shape of the meniscus and include effects related to the contact angles. However, an order of magnitude estimate of this pressure depression is given by:

$$p_m = p_{amb} - p_w - \frac{4\sigma}{h}$$

where $p_{amb}$ is the ambient pressure, $p_w$ is the withdrawal pressure, σ is the surface tension and h is the gap height (see FIG. 9). See generally J. Fay, Introduction to Fluid Mechanics, MIT Press, Cambridge, Mass. (1994), which is incorporated herein by reference in its entirety.

Figure 10:
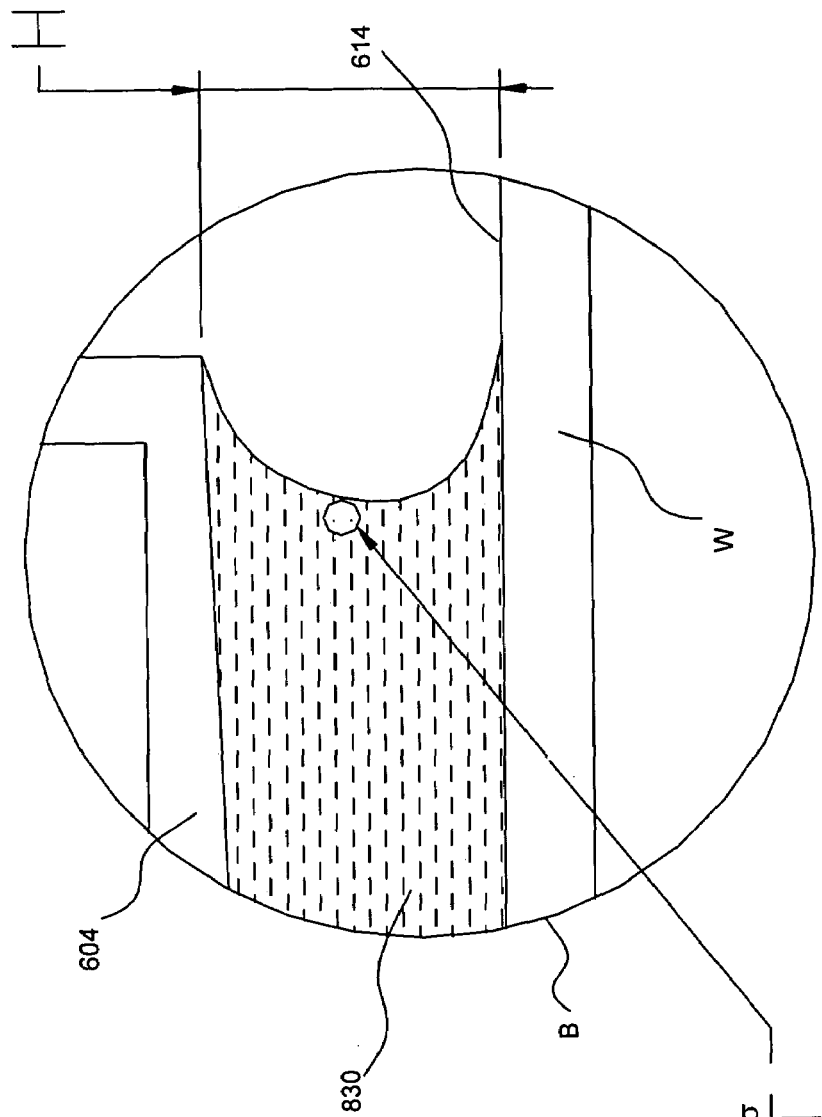
FIG. 10 illustrates a meniscus region B of FIG. 8.

FIG. 10 illustrates a region B from FIG. 8 with a gap height "H" between showerhead 604 and substrate W.

Note that the meniscus is inward shaped, with the pressure in the liquid given by:

$$p_M = p_{amb} - p_w - \frac{4\sigma}{H}$$

Because H>h, $p_M$>$p_m$ and liquid will start flowing from the side that has the larger gap.

Figure 11:
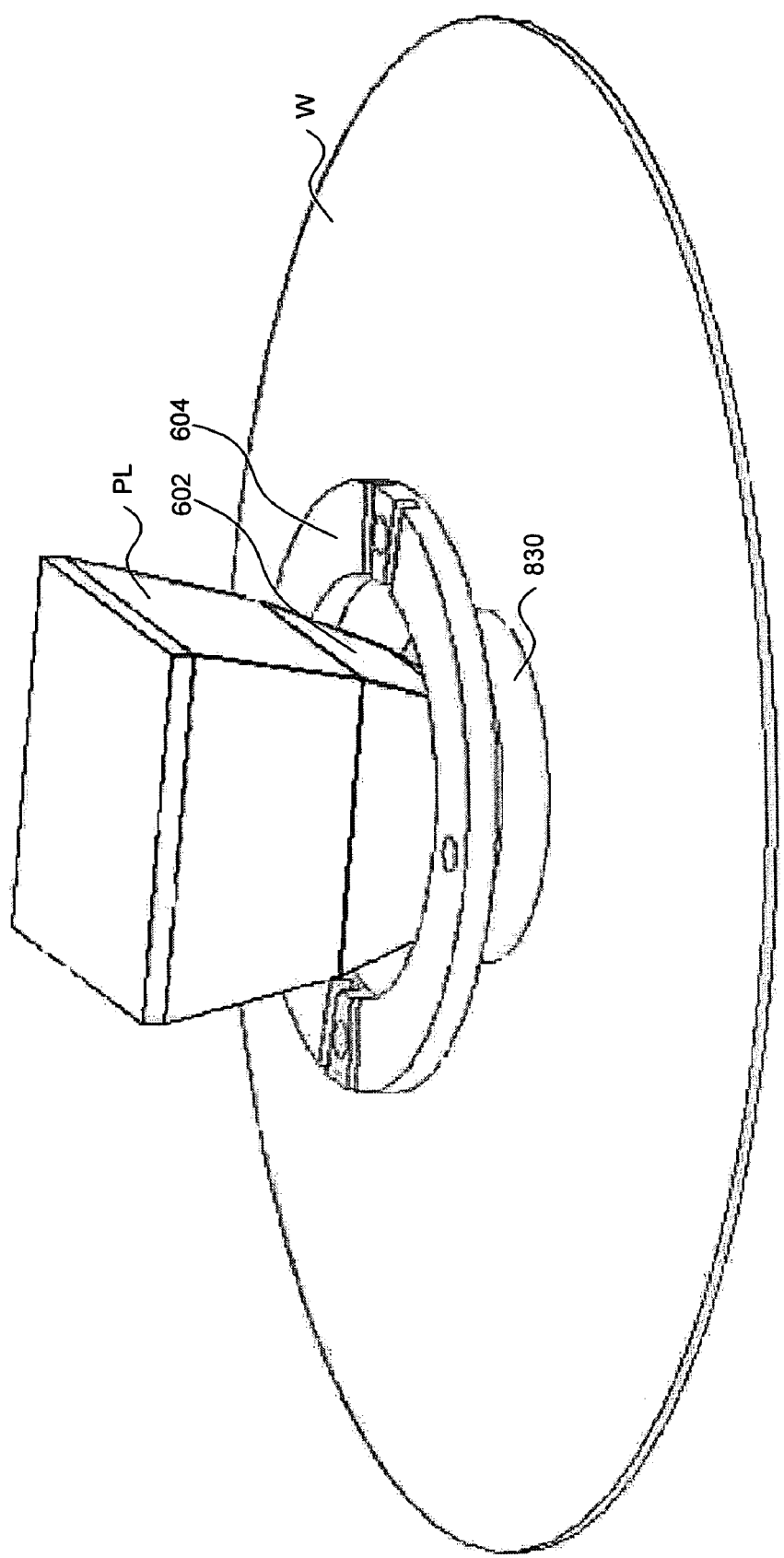
FIG. 11 illustrates a three-dimensional isometric view of the embodiment illustrated in FIGS. 6-10.

FIG. 11 is another illustration of the embodiment illustrated in FIG. 6-10, in this case, a three-dimensional isometric view. Shown in FIG. 11 is the substrate W positioned below projection system PL (only a portion of which is shown). Showerhead 604 is visible in the figure, with immersion liquid 830 flowing under projection optics PL.

With general reference again to FIG. 6, additionally, or alternatively, it is possible to accomplish the tilting effect by tilting substrate W. For example, this can be done using the controller 606 to control substrate stage WT. Normally, substrate W is kept substantially horizontal (with respect to the perspective shown) to ensure good image quality. However, it is possible to tilt substrate W using substrate stage WT, or another equivalent device, such that substrate W is tilted by a predetermined amount, for example, about the tilt angles discussed above. As discussed above, the tilting can be done so as to cause liquid flow in the direction from the injection nozzle to the extraction nozzle and/or to allow for optimal gap height between showerhead 604 and substrate W.

Additionally or alternatively, tilting of the lithography system can be performed. Such an approach may be more complicated to implement than the embodiments described above, since tilting the entire lithographic system may be undesirable or mechanically problematic. However, such a tilting of the entire lithographic system can accomplish the same purpose, i.e., creation of a direction of liquid flow even in the absence of suction pressure for extraction.

Additionally, or alternatively, the tilting effect can be simulated using forced air or gas flow. For example, even if the injection and extraction nozzles 610 and/or 612 are level with each other, and substrate W is also oriented substantially horizontally, an air or gas pressure gradient in the direction from the first nozzle 610 to second nozzle 612, or vice versa, can also achieve a similar effect, i.e., overcoming the surface tension forces that otherwise impede liquid flow.

Additionally, or alternatively, tilt can be controlled during exposure, between pulses of radiation source, or during other intermittent portions of a lithography cycle.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool and/or an inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157, 126 nm, or other wavelengths).

The term "lens", where the context allows, can refer to any one or combination of various types of optical components, including refractive and reflective optical components.

While specific embodiments of the invention have been described above, it will be appreciated that the invention can be practiced otherwise than as described. For example, where applicable, the invention can take the form of a computer program containing one or more sequences of machine-readable instructions describing a method as disclosed above, or a data storage medium (e.g., semiconductor memory, magnetic or optical disk) having such a computer program stored therein.

One or more embodiments of the invention can be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it can be a mechanism or combination of structures that provides a liquid to a space between the projection system and the substrate and/or substrate table. It can comprise a combination of one or more structures, one or more liquid inlets, one or more gas inlets, one or more gas outlets, and/or one or more liquid outlets that provide liquid to the space. In an embodiment, a surface of the space can be a portion of the substrate and/or substrate table, or a surface of the space can completely cover a surface of the substrate and/or substrate table, or the space can envelop the substrate and/or substrate table. The liquid supply system can optionally further include one or more elements to control the position, quantity, quality, shape, flow rate or any other features of the liquid.

The immersion liquid used in the apparatus can have different compositions, according to the desired properties and the wavelength of exposure radiation used. For an exposure wavelength of 193 nm, ultra pure water or water-based compositions can be used and for this reason the immersion liquid is sometimes referred to as water and water-related terms such as hydrophilic, hydrophobic, humidity, etc. can be used.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. An immersion lithography system, comprising:
    projection optics that direct a patterned beam onto a substrate supported by a substrate stage; and
    a showerhead that delivers liquid between the projection optics and the substrate, wherein the showerhead includes a first nozzle located at a first distance from the substrate and a second nozzle located at a second distance from the substrate; and
    a controller configured to adjust one of the first and second distances with respect to the first or second nozzle based on a scanning parameter received from the projection optics or the substrate stage, while maintaining the showerhead at a constant angle with respect to the substrate.

2. The immersion lithography system of clam 1, wherein the scanning parameter is a scanning speed.

3. The immersion lithography system of claim 1, wherein:
    one of the first and second nozzles is an injection nozzle and another one of the first and second nozzles is a retrieval nozzle, which function is dynamically adjusted based on a scanning direction of the substrate with respect to the projection optics; and
    the injection nozzle is farther away from a surface of the substrate than the retrieval nozzle.

4. A method, comprising:
    projecting a patterned beam of radiation onto a target portion of a substrate, supported by a substrate stage, using a projection system;
    using a liquid supply system to at least partially fill a space between the projection system and the substrate with an immersion liquid; and
    producing an immersion liquid portion having a first and a second meniscus using the liquid supply system, while maintaining the liquid supply system at a constant angle with respect to the substrate, wherein the first meniscus is larger than the second meniscus, wherein sizes of the first and second menisci are based on a scanning speed detected or known with respect to the substrate stage.

5. The method of claim 4, further comprising:
    providing the liquid supply system with first and second nozzles; and
    moving one of the first or second nozzles with respect to another one of the first or second nozzles, such that one of the first and second nozzles is closer to a surface of the substrate.

* * * * *

UNITED STATES PATENT AND TRADEMARK OFFICE
CERTIFICATE OF CORRECTION

| | | |
|---|---|---|
| PATENT NO. | : 7,256,864 B2 | Page 1 of 1 |
| APPLICATION NO. | : 11/403196 | |
| DATED | : August 14, 2007 | |
| INVENTOR(S) | : Kate et al. | |

It is certified that error appears in the above-identified patent and that said Letters Patent is hereby corrected as shown below:

<u>Column 1</u>
Line 35, please delete the extra word "pattern".

Signed and Sealed this

Fourth Day of December, 2007

JON W. DUDAS
*Director of the United States Patent and Trademark Office*